(12) United States Patent
Lee et al.

(10) Patent No.: US 7,625,787 B2
(45) Date of Patent: Dec. 1, 2009

(54) THIN SILICON-ON-INSULATOR HIGH VOLTAGE TRANSISTOR WITH BODY GROUND

(75) Inventors: Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 264 days.

(21) Appl. No.: 11/897,691

(22) Filed: Aug. 31, 2007

(65) Prior Publication Data

US 2009/0057758 A1 Mar. 5, 2009

(51) Int. Cl.
*H01L 21/00* (2006.01)
(52) U.S. Cl. .............. 438/157; 438/140; 257/E29.259; 257/E29.261
(58) Field of Classification Search .......... 438/157; 257/E29.259, E29.261
See application file for complete search history.

(56) References Cited

U.S. PATENT DOCUMENTS

| 6,706,569 | B2* | 3/2004 | Kim et al. .............. 438/149 |
|---|---|---|---|
| 2002/0020877 | A1* | 2/2002 | Mandelman et al. ........ 257/350 |
| 2002/0109187 | A1* | 8/2002 | Matsumoto et al. ......... 257/347 |
| 2002/0145174 | A1* | 10/2002 | Aipperspach et al. ....... 257/510 |
| 2008/0182394 | A1* | 7/2008 | Yang et al. ................. 438/510 |

OTHER PUBLICATIONS

N. Nenadovic, et al, "RF Power Silicon-On-Glass VDMOSFETs" IEEE EDL25, #6 p424, 2004.
M. Wasekura et al, "An SOI-BiCDMOS Chipset for Automotive Electronically Controlled Brake System" 2006 IEEE SOI International OSI conference Proceeding, Paper 7.1.

* cited by examiner

*Primary Examiner*—Thao X Le
*Assistant Examiner*—Ker-Ming Chin
(74) *Attorney, Agent, or Firm*—Law Office of Gerald Maliszewski; Gerald Maliszewski

(57) ABSTRACT

A silicon (Si)-on-insulator (SOI) high voltage transistor with a body ground is provided with an associated fabrication process. The method provides a SOI substrate with a buried oxide (BOX) layer and a Si top layer having a first thickness and a second thickness, greater than the first thickness. A body ground is formed in the second thickness of Si top layer overlying the BOX layer. A control channel is formed in the first thickness of the Si top layer. A control gate is formed overlying the control channel. An auxiliary channel is formed in the second thickness of Si top layer partially overlying the body ground and extending into the first thickness of the Si top layer. An auxiliary gate is formed overlying the auxiliary channel. A pn junction is formed in the second thickness of Si top layer between the auxiliary channel and the body ground.

10 Claims, 5 Drawing Sheets

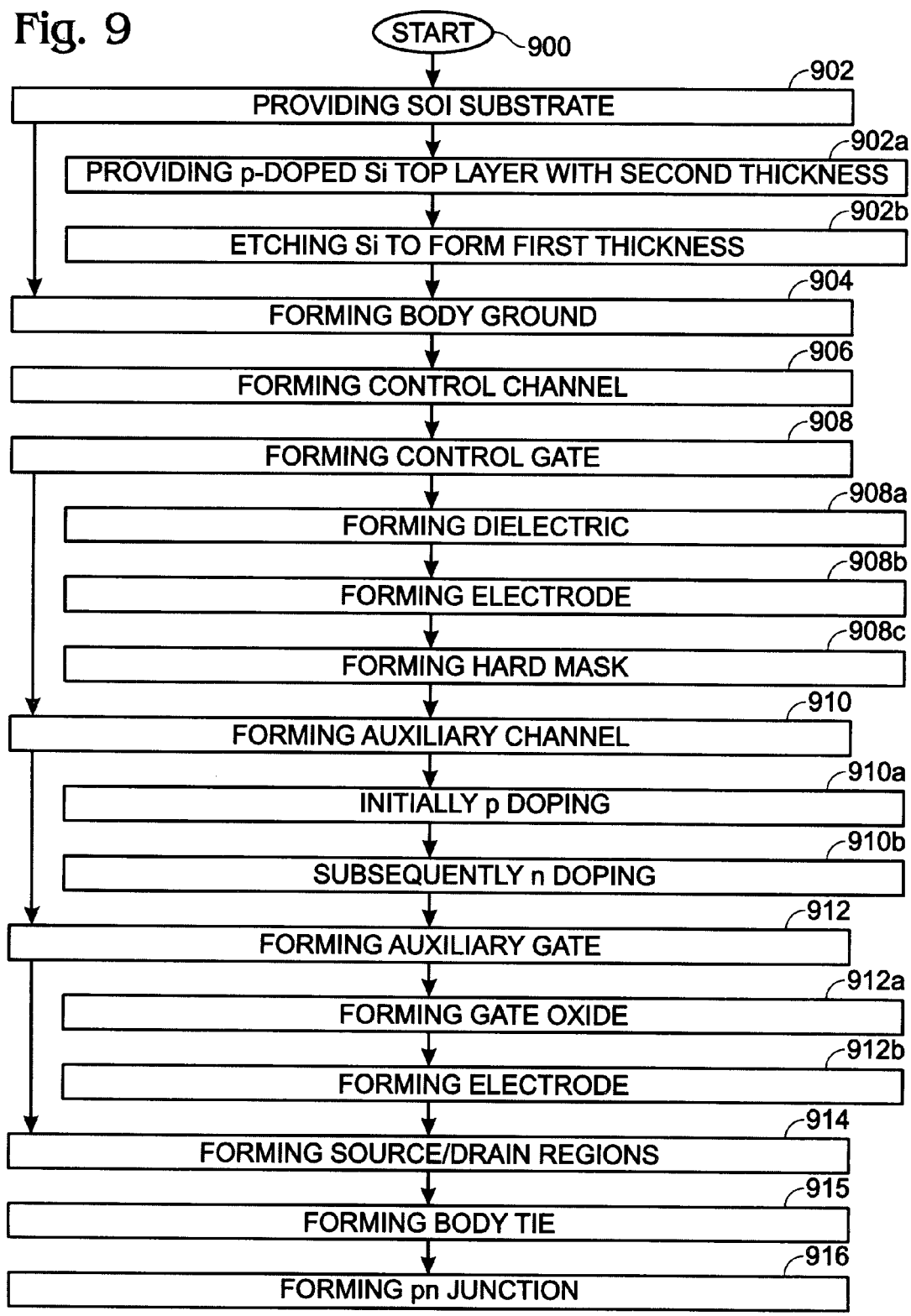

THIN SILICON-ON-INSULATOR HIGH VOLTAGE TRANSISTOR WITH BODY GROUND

BACKGROUND OF THE INVENTION

1. Field of the Invention

This invention generally relates to integrated circuit (IC) fabrication and, more particularly, to a high voltage metal oxide semiconductor (MOS) cascode transistor device formed on a silicon-on-insulator (SOI) substrate with a body ground.

2. Description of the Related Art

FIG. 1 is a partially cross-sectional view of a vertical output DMOST device with substrate contact to the drain output (prior art). One limitation of a conventional planar MOS device is that the channel length is proportional to the breakdown voltage, but inversely proportional to current. That is, high current planar devices require a very short channel length and, therefore, have a very low breakdown voltage. To address this short channel limitation, DMOST devices were developed. A DMOST device is formed by a double-diffusion. For example, an n-channel DMOST is conventionally formed by a deep p+ implant, followed by a shallow n+ implant. Unlike planar MOS devices, which control channel length using a photolithographic process, the channel length of a DMOST is controlled by the difference between the diffusions of the p+ implant and the n+ implant species to form a p-body and n+ source regions.

State-of-the-art high voltage high power transistors are conventionally fabricated either on bulk silicon or on compound semiconductors. Compound semiconductor substrate costs are very high. In addition, the compound semiconductor processes are not compatible with silicon integrated circuit processes. As a result, compound semiconductor high voltage high power devices are not suitable for consumer applications. If fabricated on bulk silicon, the high voltage transistor must be a DMOST design. A DMOST utilizes double diffusion to form a very short channel length transistor with a very long depletion region to sustain high voltages.

A bulk silicon DMOST conventionally requires a large device area and, in addition, the output is made via the substrate contact, "underneath" the transistor active regions. Although front ("top") output lateral DMOSTs (LDMOSTs) have also been fabricated, the area required for these devices is even larger than for back output devices. The depletion area of the DMOST, whether it is back output or front output device, is also very large. The depletion region is the main source of the leakage current, which increases exponentially with temperature. Thus, the bulk silicon DMOST is not suitable for high temperature high voltage applications.

The use of silicon-on-insulator (SOI) substrates offers many potential advantages for the fabrication of high temperature power devices. Some of the potential advantages are: complete device isolation, small device size, low leakage current at high temperatures, and simple fabrication processes. The complete isolation of devices eliminates crosstalk among the devices in the same chip. Because of the isolation, power devices, linear circuits, and digital circuits can be integrated together without the use of large isolation areas. Potentially, a low leakage current can be achieved by using a very thin top active silicon film. The volume of the junction depletion layer would be small enough to not generate large leakage current even at high temperatures.

Power transistors have been fabricated on SOI substrates from bipolar transistor, conventional DMOS transistor designs, or as a combination of conventional DMOS and bipolar transistors. Since conventional DMOS and bipolar transistor designs both require thick silicon films, these designs fail to make use of all the above-mentioned potential advantages available with the use of SOI substrate. For example, Philip's A-BCD technology requires a 1.5 µm layer of active silicon films. A design proposed by Nenadovic requires a 5 µm of active top silicon film, and a design proposed by Wasekura requires a 12 µm layer of top active silicon film. Since the leakage current is proportional to the volume of the junction depletion region, these thick top active silicon films generate high leakage currents, which are especially problematic at high temperatures. Further, since conventional commercially available SOI wafers are fabricated with less than a 1.5 µm top active silicon film thickness, the above-mentioned thick-film designs require a high cost, custom type of SOI wafer.

It would be advantageous if a high power MOST device could be fabricated on a SOI wafer using a thin active film region to minimize leakage current.

SUMMARY OF THE INVENTION

A unique high voltage high-power device structure is presented that can be fabricated using SOI wafers with a top active silicon layer as thin as 20 nanometers (nm), to take full advantages of SOI technology. The device is a cascode device, with a control gate and an auxiliary gate. The auxiliary gate isolates the input (control) gate from the drain output, eliminating the Miller effect of the device. The effective input capacitance is very small, making high frequency operation of the device possible. A pn junction between the auxiliary channel and a body ground formed in the substrate minimizes leakage current. Additionally, the applied voltage on the drain terminal helps deplete the auxiliary channel by means of the above-mentioned pn junction and the depleted channel absorbs a high voltage applied to the drain.

Accordingly, a method is provided for fabricating a silicon (Si)-on-insulator (SOI) high voltage transistor device with a body ground. The method provides a SOI substrate with a buried oxide (BOX) layer and a Si top layer having a first thickness (e.g., less than 500 nanometers (nm)) and a second thickness, greater than the first thickness. A body ground is formed in the second thickness of Si top layer overlying the BOX layer. A control channel is formed in the first thickness of the Si top layer. A control gate is formed overlying the control channel, and an auxiliary channel is formed in the second thickness of Si top layer partially overlying the body ground and extending into the first thickness of the Si top layer. An auxiliary gate is formed overlying the auxiliary channel. A source region is formed in the first thickness of the Si top layer adjacent the control channel, and a drain region is formed in the second thickness of Si top layer adjacent the auxiliary channel. A pn junction is formed in the second thickness of Si top layer between the auxiliary channel and the body ground. Typically, the auxiliary channel is lightly doped with a first dopant (e.g., n– doped) and the body ground lightly doped with a second dopant, opposite in polarity to the first dopant (e.g., p– doped).

In one aspect, a control gate dielectric is formed overlying the control channel, with a polycrystalline Si control gate electrode having sidewalls overlying the control gate dielectric, and a control gate dielectric hard mask overlying the control gate electrode. After implanting phosphorus or arsenic ions to complete the formation of the auxiliary channel, an auxiliary gate oxide layer is formed overlying the auxiliary channel, with a polycrystalline Si gate electrode overlying the gate oxide layer.

In another aspect, a body tie is formed in the second thickness of top Si layer overlying the body ground, electrically connecting the body ground to a reference voltage via top surface of the Si top layer. For example, the body tie may be p+ doped.

Additional details of the above-described method and an SOI high voltage cascode transistor device with body ground are presented below.

BRIEF DESCRIPTION OF THE DRAWINGS

FIG. 9 is a flowchart illustrating a method for fabricating an SOI high voltage transistor device with a body ground.

DETAILED DESCRIPTION

Figure 2:
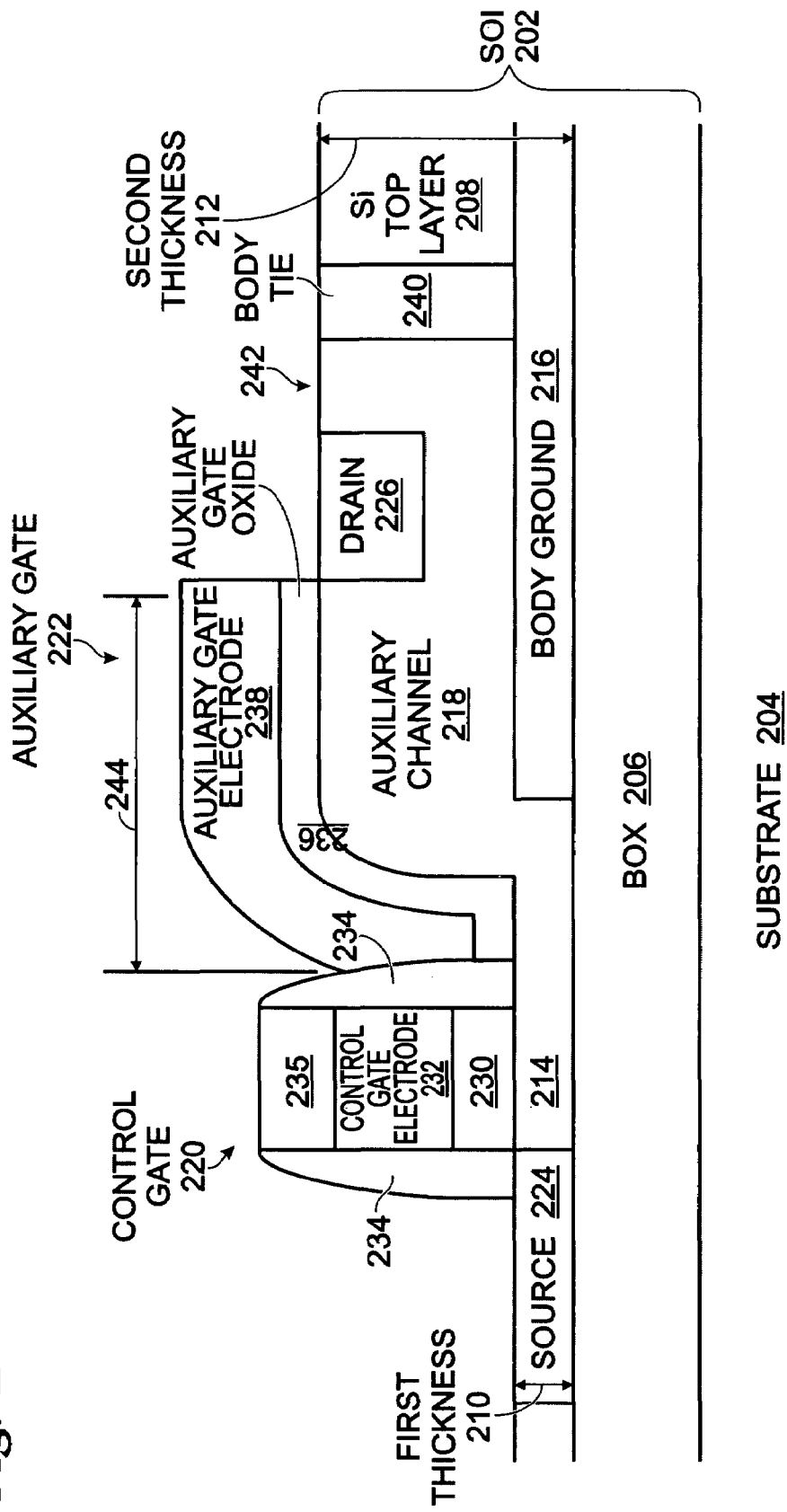
FIG. 2 is a partial cross-sectional view of a silicon (Si)-on-insulator (SOI) high voltage transistor device with a body ground.

FIG. 2 is a partial cross-sectional view of a silicon (Si)-on-insulator (SOI) high voltage transistor device with a body ground. The device 200 comprises a SOI substrate 202 with a bottom substrate layer 204, a buried oxide (BOX) layer 206, and a Si top layer 208 having a first thickness 210 and a second thickness 212, greater than the first thickness. A control channel 214 is formed in the first thickness 210 of the Si top layer 208. A body ground 216 is formed in the second thickness 212 of Si top layer 208, overlying the BOX layer 206. An auxiliary channel 218 is formed in the second thickness of Si top layer 212 partially overlying the body ground 216 and extending into the first thickness 210 of the Si top layer. In one aspect, the first thickness 210 in the Si top layer is less than 500 nanometers (nm). A control gate 220 overlies the control channel 214. An auxiliary gate 222 overlies the auxiliary channel 218.

A source region 224 is formed in the first thickness 210 of the Si top layer 208 adjacent the control channel 214. A drain region 226 is formed in the second thickness 212 of the Si top layer adjacent the auxiliary channel 218.

The auxiliary channel 218 and the body ground 216 form a pn junction connected to a reference voltage, where the "p" terminal is connected to the reference voltage. That is, the combination of the auxiliary channel 218 and body ground 216 act as a pn junction, with the p terminal connected to a reference voltage such as ground. In one aspect, the pn junction is formed from the auxiliary channel 218 being lightly doped with a first dopant, and the body ground being lightly doped with a second dopant, opposite in polarity to the first dopant.

In one aspect, the control channel 214 is doped with boron (B) ions with a density in a range of $1\times10^{16}/cm^3$ (cubic centimeters) to $1\times10^{18}/cm^3$, and the auxiliary channel 218 is effectively n– doped with a density in a range of $1\times10^{16}$ to $1\times10^{18}/cm^3$. As described in detail below, the auxiliary channel region may be exposed to multiple doping steps. In this aspect, the body ground 216 is a p– doped portion of the second thickness 212 of Si top layer 208 overlying the BOX layer 206.

In one example, the control gate 220 includes a control gate dielectric 230 overlying the control channel 214, a polycrystalline Si control gate electrode 232 with sidewalls 234 overlying the control gate dielectric 230, and a control gate dielectric hard mask 235 overlying the control gate electrode 232. The auxiliary gate 222 includes an auxiliary gate oxide layer 236 overlying the auxiliary channel 218, and a polycrystalline Si layer 238 overlying the gate oxide layer 236, forming an auxiliary gate electrode. The auxiliary gate electrode 238 may have a length 244 in a range of 1 to 10 micrometers. Although not shown in this view, in some aspects the auxiliary gate electrode 238 at least partially overlies the control gate dielectric hard mask 235 (see FIG. 5).

A body tie 240 may also be formed in the second thickness 212 of top Si layer 208 overlying the body ground 216, electrically connecting the body ground to the reference voltage via a top surface 242 of the Si top layer 208. To continue the above-described example, the body tie 240 may be p+ doped.

As used herein, a heavily doped region, e.g., a heavily p doped region, is referred to as p+ (p+ doped), and is associated with dopant concentrations in the range of about $1\times10^{19}$ to $1\times10^{21}$ cm$^{-3}$. Regions with this degree of dopant are often contact areas. A moderately doped region, e.g., a moderately p doped region, is referred to as p (p doped), and is associated with dopant concentrations in the range of about $5\times10^{16}$ to $1\times10^{19}$ cm$^{-3}$. For the n-type layers, a heavily n doped region is referred to as n+ (n+ doped) and is associated with dopant concentrations in the range of about $1\times10^{19}$ to $1\times10^{21}$ cm$^{-3}$. An area doped with p type dopant with a density less than $1\times10^{19}$ cm$^{-3}$ is referred to as p– (p– doped). As used herein, the dopant concentration is assumed to be in the range of $1\times10^{15}$ to $1\times10^{19}$ cm$^{-3}$, unless otherwise specified. The n– (n– doped) region is referred to as n doped, and is associated with dopant concentrations in the range of about $1\times10^{15}$ to $1\times10^{19}$ cm$^{-3}$. The term "n-type" refers to any amount of n doping. Likewise, "p-type" refers to any level of p doping.

Functional Description

The present invention is a unique high-voltage high-power device structure that can be fabricated using SOI wafers with top active silicon layers as thin as 20 nm and no thicker than 1000 nm, to take the full advantages of SOI technology. The device is a cascode device. It consists of a control gate and an auxiliary gate. Since the auxiliary gate isolates the input gate form the drain output, the Miller effect of the device is eliminated. The effective input capacitance is very small. The device may also be operated at high frequencies. To optimize the device performance, a compromise is made between control gate transistor and auxiliary gate transistor parameters, in order to achieve a low on-resistance and high breakdown voltage.

In this invention, the cascode device is fabricated on SOI wafers with top active silicon layer thickness thinner than about 1000 nm. A body ground coupled to the auxiliary gate transistor improves the capability of depleting the silicon under the auxiliary gate, preventing the breakdown of the control gate. The auxiliary gate threshold voltage and the applied voltage during device operation can be designed without the consideration of depletion of the auxiliary gate transistor. Although the body ground may degrade the device performance at high temperature, since the thickness of the auxiliary gate transistor body is less than 1000 nm, the junction leakage at high temperatures is still much better than a functionally similar device fabricated on bulk Si or on a thick SOI wafer.

Figure 1:
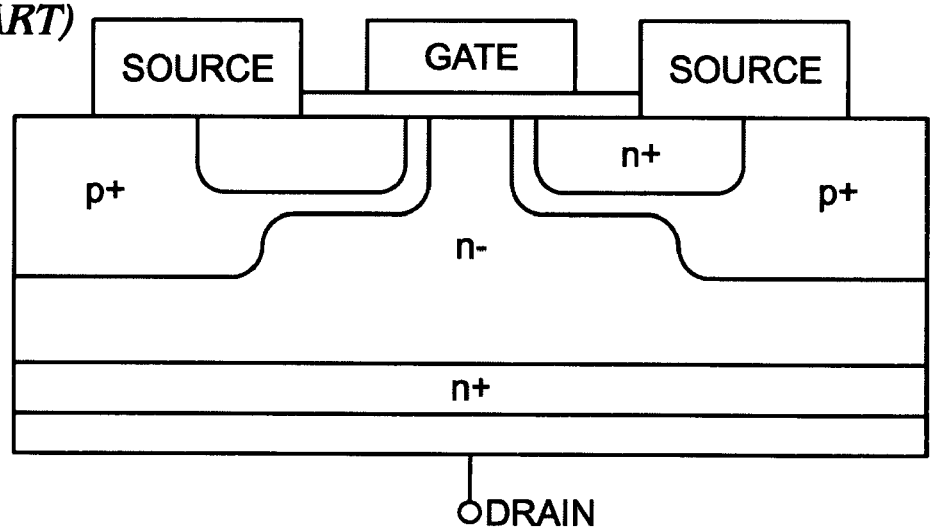
FIG. 1 is a partially cross-sectional view of a vertical output DMOST device with substrate contact to the drain (prior art).
Figure 3:
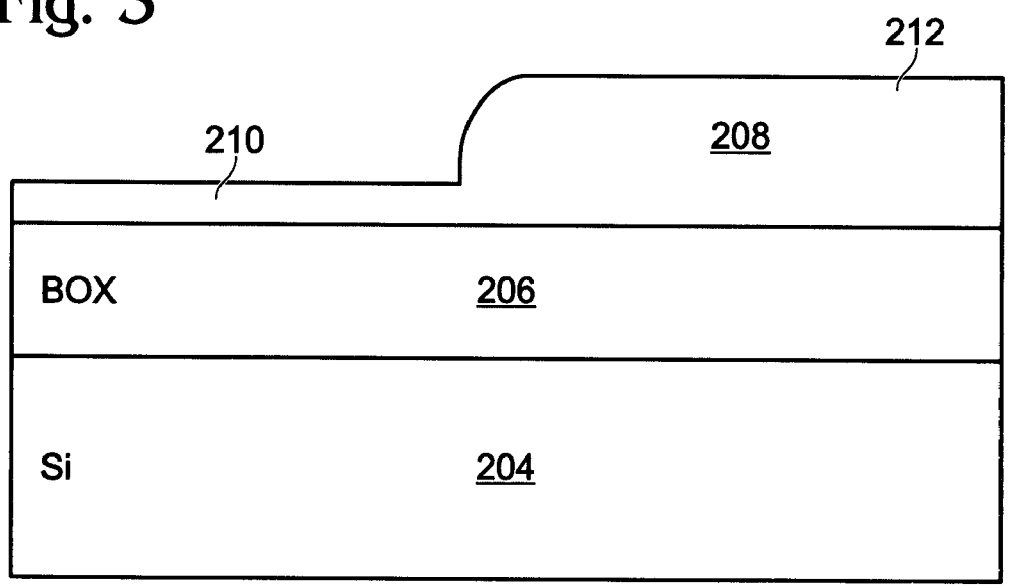
FIGS. 3 through 6 depict steps in an exemplary fabrication process for the device illustrated in FIG. 2.

FIGS. 3 through 6 depict steps in an exemplary fabrication process for the device illustrated in FIG. 2. In FIG. 3, the process starts with a SOI wafer having a top Si layer 208 thinner than about 1000 nm. The top Si layer thicknesses associated with the control gate transistor and the auxiliary gate transistor areas are then defined by thermal oxidation and subsequent oxide etching on the top silicon layer where the control transistor is to built. The final silicon layer thickness, which is the Si top layer first thickness, is less than 500 nm. The control gate transistor layer is thinner for improved short channel control, and the control gate may be a fully depleted device. The auxiliary gate transistor has thicker Si layer, for higher drive currents and higher breakdown voltages.

A channel ion implantation is performed with B for example, with densities in the range of $1\times10^{16}/cm^3$ to $1\times10^{18}/cm^3$ range, on the control gate transistor, and a body ion implant of B, in the range of $1\times10^{17}/cm^3$ to $1\times10^{19}/cm^3$ range on the auxiliary gate transistor. This process can be a blanket implantation using the top Si layer thickness differences to obtain desire dopant density at control transistor channel and auxiliary transistor body. That is, multiple blanket implants may be performed. For example, two blanket implantations are performed with one high energy implantation and one low energy implantation. In the thinner Si top layer 210, the low energy implantation implants the species into the silicon layer, while the high energy implantation implants the species into the BOX layer. In the thicker Si top layer 212, the low energy implantation implants the species into the auxiliary channel region and the high energy implantation implants the species into the body ground region 216.

Figure 4:
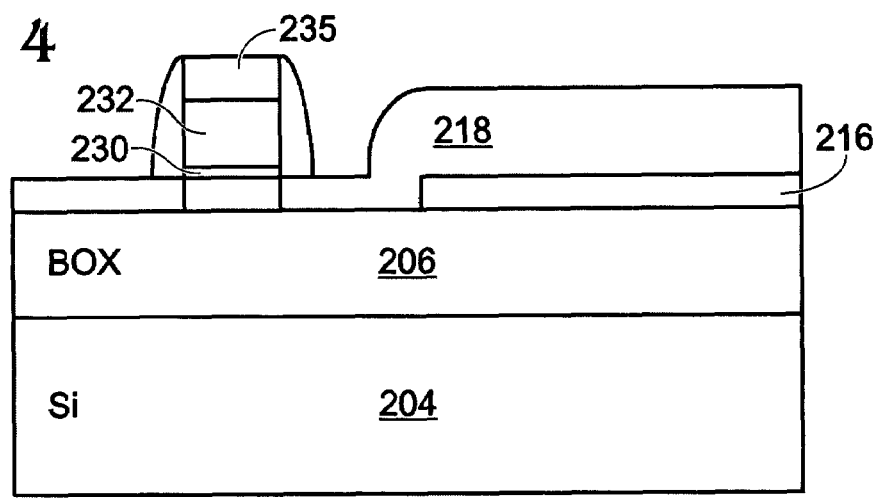

In FIG. 4, a thin gate oxide 230 is grown, polycrystalline Si (poly Si) is deposited followed by a $SiO_2$ deposition. The thin gate oxide thickness is in the range of 2 nm to 10 nm. The poly Si control gate is defined by etching, to form a poly gate electrode 232 and a $SiO_2$ dielectric layer 235. In a process similar to a low density drain (LDD) formation, dopant is implanted with a dopant density at $1\times10^{16}/cm^3$ to $1\times10^{18}/cm^3$ range. This implant is similar to a control gate LDD implant in that dopant is implanted into the Si under the control gate sidewall spacer. This process forms the auxiliary channel. No photoresist patterning is required for this implant. Therefore, this implant species diffuse into the silicon, except in the control gate channel. Subsequent n+ and p+ implants into the Si are performed, as described below.

Figure 5:
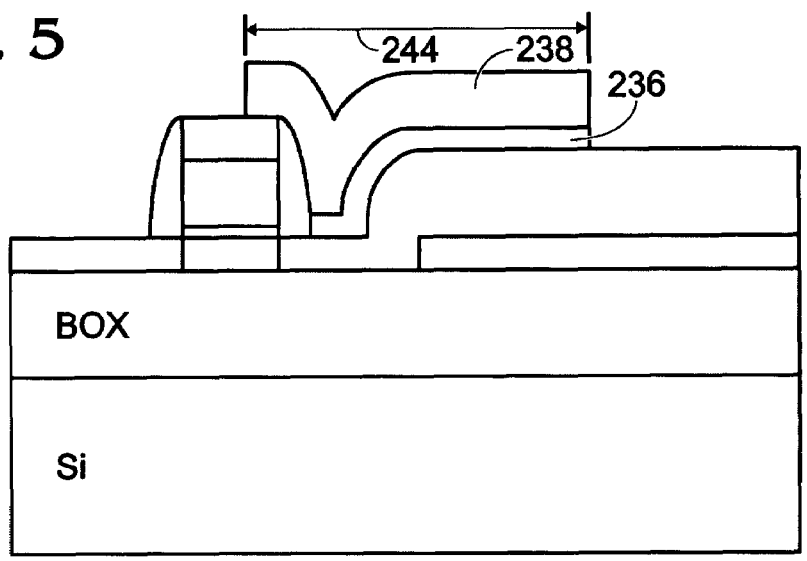

In FIG. 5, a thick gate oxide 236 is grown and a second poly Si layer 238 is deposited. The thick oxide 236 has a thickness in the range of 10 to 50 nm. The auxiliary gate is defined from the poly Si by etching. Note: optionally, one end of the auxiliary gate partially overlies top of the control gate. The auxiliary gate length 244 is between 1-10 um, so that the partial overlap does not affect the device performance.

Figure 6:
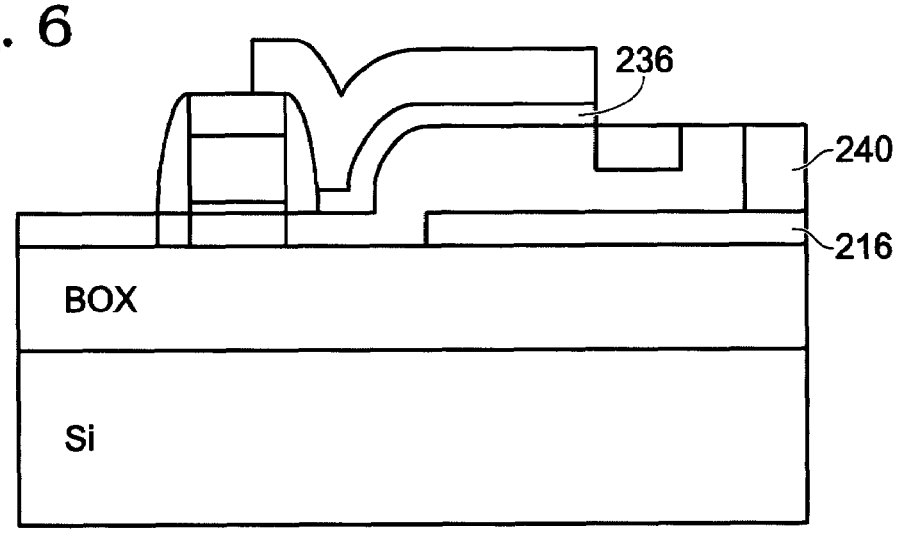

In FIG. 6, n+ and p+ ion implantations are performed. The p+ implant forms a body tie 240 with contact to the p-body ground 216 underlying the auxiliary transistor.

Figure 7:
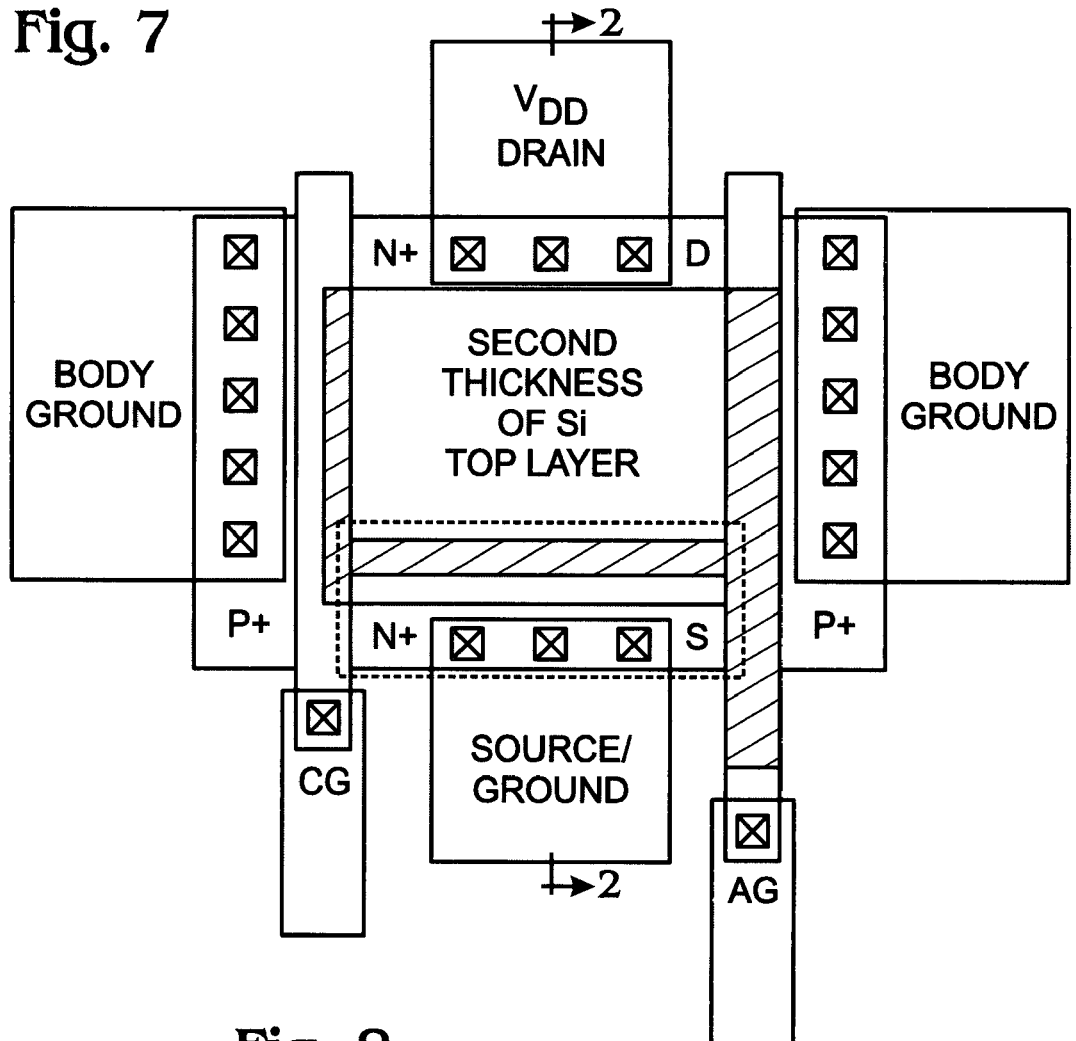
FIG. 7 is an exemplary plan view of the cascode device of FIG. 2, shown with an H-gate structure on the control transistor gate layout.

FIG. 7 is an exemplary plan view of the cascode device of FIG. 2, shown with an H-gate structure on the control transistor gate layout. Since the width of the cascode transistor is large, for high current handling capabilities, the H-gate layout on the control gate (CG) can effectively tie the auxiliary transistor body to ground potential, making a better body tie to the body ground.

Figure 8:
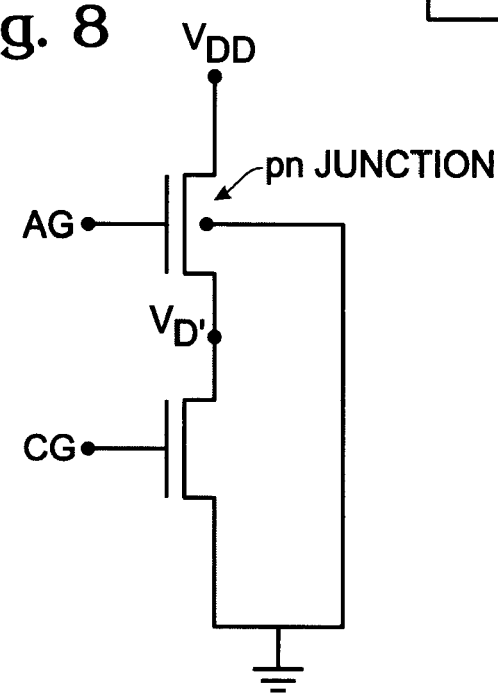
FIG. 8 is a schematic diagram depicting a circuit that is electrically equivalent circuit to the cascode power transistor device shown in FIG. 7.

FIG. 8 is a schematic diagram depicting a circuit that is electrically equivalent circuit to the cascode power transistor device shown in FIG. 7. The n– auxiliary channel is connected to $V_{DD}$ and $V_D'$, and the p-body ground is connected to ground. During normal operation the control gate is the input terminal. A positive voltage $V_{AG}$ is applied to the auxiliary gate and the drain bias voltage is $V_{DD}$. The voltage $V_{AG}$ can be slightly higher than the drain breakdown voltage of the control gate transistor. The voltage between control gate and the auxiliary gate is $V_D'$. There is a pn junction formed between the auxiliary channel and the p-body ground, as a result of n-type "LDD" equivalent implants. When $V_{DD}$ increases to voltage $V_{dep}$, the n– auxiliary channel under the auxiliary gate is depleted due to the pn junction.

More explicitly, the operation of the device is described as follows:

(1) The control gate is on and the $V_{DD}$ is smaller than $V_{dep}$. The positive $V_{AG}$ increases the electron accumulation at the auxiliary transistor channel, and reduces the device "on" resistance. The drive current is controlled by the control gate.

(2) The control gate is on and the $V_{DD}$ is higher than $V_{dep}$. The silicon under the auxiliary gate is completely depleted and absorbs the drain voltage. When $V_D'$ equals $V_{dep}$, electrons under the auxiliary gate are swiftly drained. The drive current is controlled by the control gate.

(3) The control gate is off and the $V_{DD}$ is smaller than $V_{dep}$. $V_{AG}$ is relatively large at low drain bias voltages. The device is operated in the linear region and the auxiliary gate has little effect on the device current. $V_D'$ is very close to $V_{DD}$ in this condition. Therefore, the control transistor is designed to have higher breakdown voltage than the $V_{dep}$.

(4) The control gate is off and $V_{DD}$ is higher than $V_{dep}$. The silicon under the auxiliary gate is completely depleted. The silicon under the auxiliary gate becomes a drift region which prevents the breakdown at the control gate drain.

FIG. 9 is a flowchart illustrating a method for fabricating an SOI high voltage transistor device with a body ground. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a SOI substrate with a buried oxide (BOX) layer and a Si top layer having a first thickness and a second thickness, greater than the first thickness. In one aspect, the first thickness in the Si top layer is less than 500 nm, while the second thickness is typically less than 1000 nm. In another aspect, the Si first thickness is less than 100 nm, so a fully depleted control transistor can be easily made. Step 904 forms a body ground in the second thickness of Si top layer overlying the BOX layer. Step 906 forms a control channel in the first thickness of the Si top layer. Step 908 forms a control gate overlying the control channel. Step 910 forms an auxiliary channel in the second thickness of Si top layer partially overlying the body ground and extending into the first thickness of the Si top layer. Step 912 forms an auxiliary gate overlying the auxiliary channel. Step 914 forms a source region in the first thickness of the Si top layer adjacent the control channel, and forms a drain region in the second thickness of Si top layer adjacent the auxiliary channel. Step 916 forms a pn junction in the second thickness of Si top layer between the auxiliary channel and the body ground.

In one exemplary aspect, forming the pn junction in Step 916 includes the auxiliary channel being lightly doped with a first dopant, and the body ground being lightly doped with a second dopant, opposite in polarity to the first dopant.

Continuing the example, providing the SOI substrate with the BOX layer and a Si top layer in Step 902 may include substeps. Step 902a provides a p– Si top layer having the second thickness. Step 902b selectively etches the Si top layer to form a region with the first thickness. Then, Step 906 forms the control channel by implanting B ions with a density in a range of $1 \times 10^{16}/cm^3$ to $1 \times 10^{18}/cm^3$ range, and Step 910a forms the auxiliary channel by (initially) implanting B ions with a density in a range of $1 \times 10^{17}/cm^3$ to $1 \times 10^{19}/cm^3$.

Continuing the example, forming the body ground in Step 904 may include leaving p– doped a portion of the second thickness overlying the BOX layer. This step assumes that the Si top layer provided in Step 902 is initially p– doped. Forming the control gate overlying the control channel in Step 908 may include the following substeps. Step 908a forms a control gate dielectric overlying the control channel. Step 908b forms a polycrystalline Si control gate electrode with sidewalls overlying the control gate dielectric. Step 908c forms a control gate dielectric hard mask overlying the control gate electrode. Then, forming the auxiliary channel in Step 910b includes (subsequent to Step 910a) implanting ions of either phosphorus or arsenic with a density in the range of $1 \times 10^{16}/cm^3$ to $1 \times 10^{18}/cm^3$ to form the auxiliary channel. Subsequent to forming the auxiliary channel, forming the auxiliary gate includes forming an auxiliary gate oxide layer overlying the auxiliary channel (Step 912a). Step 912b deposits a polycrystalline Si layer overlying the gate oxide layer, forming an auxiliary gate electrode. For example, the auxiliary gate electrode may have a length in the range of 1 to 10 micrometers. Optionally, the auxiliary gate electrode may at least partially overlie the control gate dielectric hard mask.

In another aspect, Step 915 forms a body tie in the second thickness of top Si layer overlying the body ground, electrically connecting the body ground to a reference voltage via top surface of the Si top layer.

A SOI high voltage cascode transistor with body ground and an associated fabrication process have been provided. Specific examples of structures, materials, doping levels, and layer thicknesses have been given to illustrate the invention. However, the invention is not limited to just these examples. Other variations and embodiments of the invention will occur to those skilled in the art.

We claim:

1. A method for fabricating a silicon (Si)-on-insulator (SOI) high voltage transistor device with a body ground, the method comprising:
   providing a SOI substrate with a buried oxide (BOX) layer and a Si top layer having a first thickness and a second thickness, greater than the first thickness;
   forming a body ground in the second thickness of Si top layer overlying the BOX layer;
   forming a control channel in the first thickness of the Si top layer;
   forming a control gate overlying the control channel;
   forming an auxiliary channel in the second thickness of Si top layer partially overlying the body ground and extending into the first thickness of the Si top layer;
   forming an auxiliary gate overlying the auxiliary channel;
   forming a source region in the first thickness of the Si top layer adjacent the control channel, and a drain region in the second thickness of Si top layer adjacent the auxiliary channel; and,
   forming a pn junction in the second thickness of Si top layer between the auxiliary channel and the body ground.

2. The method of claim 1 wherein forming the first thickness in the Si top layer includes forming a first thickness of less than 500 nanometers (nm).

3. The method of claim 1 wherein forming the pn junction in the second thickness of Si top layer between the auxiliary channel and the body ground includes forming:
   the auxiliary channel lightly doped with a first dopant; and,
   the body ground lightly doped with a second dopant, opposite in polarity to the first dopant.

4. The method of claim 3 wherein providing the SOI substrate with the BOX layer and a Si top layer includes:
   providing a p– Si top layer having the second thickness;
   selectively etching the Si top layer to form a region with the first thickness;
   wherein forming the control channel includes implanting boron (B) ions with a density in a range of $1 \times 10^{16}/cm^3$ (cubic centimeters) to $1 \times 10^{18}/cm^3$ range; and,
   wherein forming the auxiliary channel includes initially implanting B ions with a density in a range of $1 \times 10^{17}/cm^3$ to $1 \times 10^{19}/cm^3$.

5. The method of claim 4 wherein forming the control gate overlying the control channel includes:
   forming a control gate dielectric overlying the control channel;
   forming a polycrystalline Si control gate electrode with sidewalls overlying the control gate dielectric;
   forming a control gate dielectric hard mask overlying the control gate electrode;
   wherein forming the auxiliary channel includes implanting ions selected from a group consisting of phosphorus and arsenic with a density in a range of $1 \times 10^{16}/cm^3$ to $1 \times 10^{18}/cm^3$;
   wherein forming the auxiliary gate includes:
   subsequent to forming the auxiliary channel, forming an auxiliary gate oxide layer overlying the auxiliary channel; and,
   depositing a polycrystalline Si layer overlying the gate oxide layer, forming an auxiliary gate electrode.

6. The method of claim 5 wherein providing the SOI substrate with the BOX layer and a Si top layer includes providing a p– doped Si top layer; and,
   wherein forming the body ground includes leaving p– doped a portion of the second thickness overlying the BOX layer.

7. The method of claim 1 further comprising:
   forming a body tie in the second thickness of top Si layer overlying the body ground, electrically connecting the body ground to a reference voltage via top surface of the Si top layer.

8. The method of claim 7 wherein forming the body tie includes p+ doping the body tie.

9. The method of claim 5 wherein forming the auxiliary gate electrode includes forming an auxiliary gate electrode having a length in a range of 1 to 10 micrometers.

10. The method of claim 5 wherein forming the auxiliary gate electrode includes forming the auxiliary gate electrode at least partially overlying the control gate dielectric hard mask.

* * * * *